(12) United States Patent
Bender

(10) Patent No.: US 8,102,656 B2
(45) Date of Patent: Jan. 24, 2012

(54) MODULE MOUNTING SYSTEM

(75) Inventor: Shawn Bender, Campbell, CA (US)

(73) Assignee: Cisco Technology, Inc., San Jose, CA (US)

( * ) Notice: Subject to any disclaimer, the term of this patent is extended or adjusted under 35 U.S.C. 154(b) by 811 days.

(21) Appl. No.: 12/173,106

(22) Filed: Jul. 15, 2008

(65) Prior Publication Data

US 2010/0014257 A1 Jan. 21, 2010

(51) Int. Cl.
*H05K 7/00* (2006.01)
(52) U.S. Cl. .................. 361/728; 361/800; 361/796
(58) Field of Classification Search .............. 361/728, 361/730, 752, 796, 800, 816, 818, 794; 312/223.1, 312/223.2
See application file for complete search history.

(56) References Cited

U.S. PATENT DOCUMENTS

| | | | | | |
|---|---|---|---|---|---|
| 4,780,570 | A | * | 10/1988 | Chuck | 174/369 |
| 4,821,145 | A | * | 4/1989 | Corfits et al. | 361/692 |
| 5,777,854 | A | * | 7/1998 | Welch et al. | 361/800 |
| 6,043,992 | A | * | 3/2000 | Scheibler | 361/818 |
| 6,194,653 | B1 | * | 2/2001 | McMiller et al. | 174/354 |
| 6,284,970 | B1 | * | 9/2001 | Buskmiller et al. | 174/377 |
| 6,837,554 | B2 | * | 1/2005 | Yamamoto et al. | 312/223.2 |
| 6,937,475 | B2 | * | 8/2005 | Rigimbal et al. | 361/752 |
| 7,113,392 | B2 | | 9/2006 | Lu et al. | |
| 7,468,892 | B2 | * | 12/2008 | Mueller et al. | 361/752 |

* cited by examiner

*Primary Examiner* — Hung S Bui

(57) ABSTRACT

An apparatus (10) comprises a module (12); a chassis (30) into which the module (12) is able to be inserted; and a first resilient member (38). The resilient member (38) interposes between the module (12) and a weight bearing surface (32) of the chassis (30), when the module (12) is inserted into the chassis (30), so as to bear at least a portion of the weight of the module (12). When the first resilient member (38) bears at least a portion of the weight of the module (12), the module (12) is at a desired position inside the chassis (30).

16 Claims, 7 Drawing Sheets

MODULE MOUNTING SYSTEM

TECHNICAL FIELD

The present disclosure relates generally to a modular apparatus having a module and chassis into which the module is able to be inserted.

BACKGROUND

Using a modular apparatus having a chassis and insertable modules provides a convenient manner of assembly and change out of components housed in one or more of the modules. Typically a module is inserted into a chassis. A connector of the module interfaces with the chassis and/or other components via another connector mounted inside the chassis. There may be one or more connectors mounted in the chassis. Each chassis connector is mounted at a nominally floating position. Each chassis connector usually allows variations from nominal positioning and orientation of the module and the module's connector, which accommodates manufacturing variations. However, when a module is installed into the chassis, gravity will cause it to be located at the lowermost position available. Further, when the module interfaces with a connector of the chassis the inclination to drop to the lowermost position due to gravity will usually bring it out of nominal positioning. This in turn reduces the amount of tolerance available to accommodate manufacturing variations. The result is that current modules tend to be misaligned, biased or cocked when interfaced with the respective connector. This can produce stress in the module and the connectors.

BRIEF DESCRIPTION OF THE DRAWINGS

In order to provide a better understanding of the appended claims, embodiments are described below, by way of example only, with reference to the accompanying drawings, in which:

DESCRIPTION OF EXAMPLE EMBODIMENTS

Overview

Figure 1:
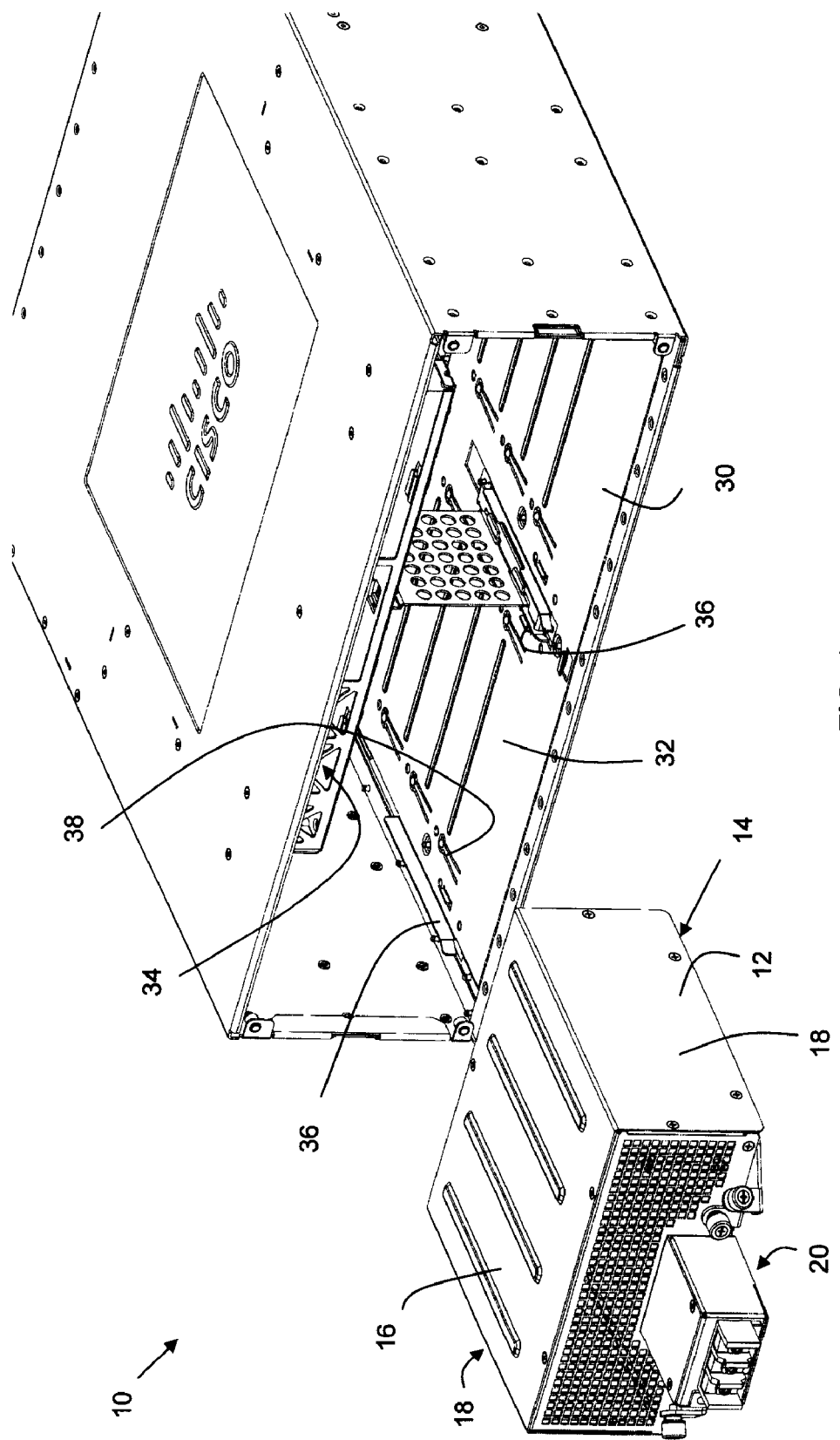
FIG. 1 is schematic perspective view of an embodiment of a module and chassis of an apparatus.

According to an embodiment there is provided an apparatus comprising:
a module;
a chassis into which the module is able to be inserted; and
a first resilient member which interposes between the module and a weight bearing surface of the chassis, when the module is inserted into the chassis, so as to bear at least a portion of the weight of the module;
wherein when said first resilient member is bearing at least a portion of the weight of the module, said module is at a desired position inside the chassis.

According to an embodiment there is provided a module comprising:
a module body able to be inserted inside a chassis; and
a first resilient member engagable with a weight bearing surface of the chassis such that the first resilient member bears at least a portion of the weight of the module when the module body is inserted into the chassis;
wherein when said first resilient member is bearing at least a portion of the weight of the module the module body is substantially at a desired position relative to the weight bearing surface.

According to an embodiment there is provided a chassis comprising:
a chassis body into which a module can be is inserted, the module having a bottom surface; and
a first resilient member engageable with the bottom surface so that when the module is inserted in the chassis the first resilient member bears at least a portion of the weight of the module;
wherein when said first resilient member is bearing at least a portion of the weight of the module the module is at a desired position relative to the bottom surface.

According to an embodiment there is provided an apparatus comprising:
means for interposing a first resilient member between the module and a weight bearing surface of the chassis such that the first resilient member bears at least a portion of the weight of the module when the module is inserted into the chassis;
means for positioning the module at a desired position inside the chassis when said first resilient member is bearing at least a portion of the weight of the module.

According to an embodiment there is provided an apparatus comprising:
means for positioning the module at a desired position inside the chassis by a weight bearing surface of the chassis resiliently bearing at least a portion of the weight of the module.

According to an embodiment there is provided a method comprising:
inserting a module into a chassis;
interposing a first resilient member between the module and a weight bearing surface of the chassis such that the first resilient member bears at least a portion of the weight of the module when the module is inserted into the chassis;
positioning the module at a desired position inside the chassis when said first resilient member is bearing at least a portion of the weight of the module.

According to an embodiment there is provided a method comprising:
inserting a module into a chassis;
positioning the module at a desired position inside the chassis by a weight bearing surface of the chassis resiliently bearing at least a portion of the weight of the module.

Detailed Description of Examples

Referring to the Figures, there is shown an embodiment of an apparatus 10 which comprises a module 12 having a module body, and a chassis 30 having a chassis body. The module 12 is able to be inserted into the chassis 30 with a relatively small clearance, of for example 0.1-10 mm and typically 1-2 mm. When the module 12 is inserted into the chassis one or more first resilient members 38 are interposed between the module 12 and a weight bearing surface 32 of the chassis 30. In this embodiment the weight bearing surface 32 is a lower inside surface of the chassis 30. The first resilient members 38 each bear at least a portion of the weight of the module 12. In an embodiment the first resilient members 38 are elongate and deflect along their length when bearing at least a portion of the weight of the module 12 so that the module 12 rests at a desired position inside the chassis 30.

In an embodiment the deflection of the first resilient members is due only to the weight of the module 12. That is the module 12 rests its weight on the resilient members 38 and no other downward biasing force is applied. When the module 12 is inserted and the first resilient members 38 bear at least a portion of the weight of the module 12 by deflecting a respective first amount. The portion of the weight of the module 12 carried by each resilient member 38 will depend on the distribution of the resilient members 38 relative to a bottom surface 14 of the module 12 and the position of the center of gravity of the module 12.

In an alternative embodiment one or more second resilient members 38' are interposed between the module 12 and a second surface 34 when the module 12 is inserted into the chassis 30. The second surface 34 is an upper inside surface of the chassis 30 opposite the weight bearing surface 32. In an embodiment the second resilient members 38' are resiliently deflectable along their length. When the module 12 is inserted in the chassis 30 both the first resilient members 38 and the second resilient member 38' are deflected due the positioning of the members 38 and 38' and the size of the module 12. The module 12 becomes sandwiched between the second surface 34 and the second resilient members 38' on its upper side 16, and the first resilient members 38 and the weight bearing surface 32 on its lower side 14.

In this embodiment, when the module 12 is inserted into the chassis 30 the second resilient members 38' are deflected by a respective second amount due to the sandwiching of the module 12. Resistance to the deflection of the second resilient members 38' causes the second resilient members 38' to apply a downward biasing force to the upper surface 16 of the module 12. The biasing force, along with the weight of the module 12, is borne by the first resilient members 38.

In an embodiment the biasing force is significantly greater than the weight of the module 12, such that deflection of the first members 38 is predominately due to the force applied by the second members 38'. In other words the weight of the module 12 has little or negligible impact on the amount of deflection of the first resilient members 38. This in turn results in the weight of the module 12 having little or negligible impact on the positioning of the module 12 in the chassis 30.

The resilience of the resilient members is typically effective within an elastic range of deflection. In use, the amount of deflection of the members 38 and 38' is preferably within their elastic range of deflection.

When inserted in the chassis 30, the desired position of the module is a desired height relative to the weight bearing surface 32. In an embodiment the height is such that the module 12 is centered between the weight bearing surface 32 and the second surface 34. In addition or alternatively the height is such that a connector 22 of the module 12 is centered relative to a corresponding connector 40 of the chassis 30 or a connector of another component/module in the chassis 30. This allows the connector 22 of the module 12 to correctly (or closer to correctly) interface with the connector 40 of the chassis 30 and/or to allow other components/modules to interface with a connector 20 of the module 12.

In an embodiment the desired position of the module 12 is within a range of positions of the module body relative to the weight bearing surface 32. The resilience can provide some play or plus or minus drift and in particular allows up or down movement of the module inside the chassis. Alternatively a fixing device can be employed to fix the module in place relative to the chassis once the module it in its correct position.

The fixing device could take the form of a screw which passes through a slot which allows movement while the screw is loose. When the module is correctly positioned the screw can be tightened so as to clamp a side panel between a side surface 18 of the module and a head of the screw so at to fix the module in place.

Figure 2:
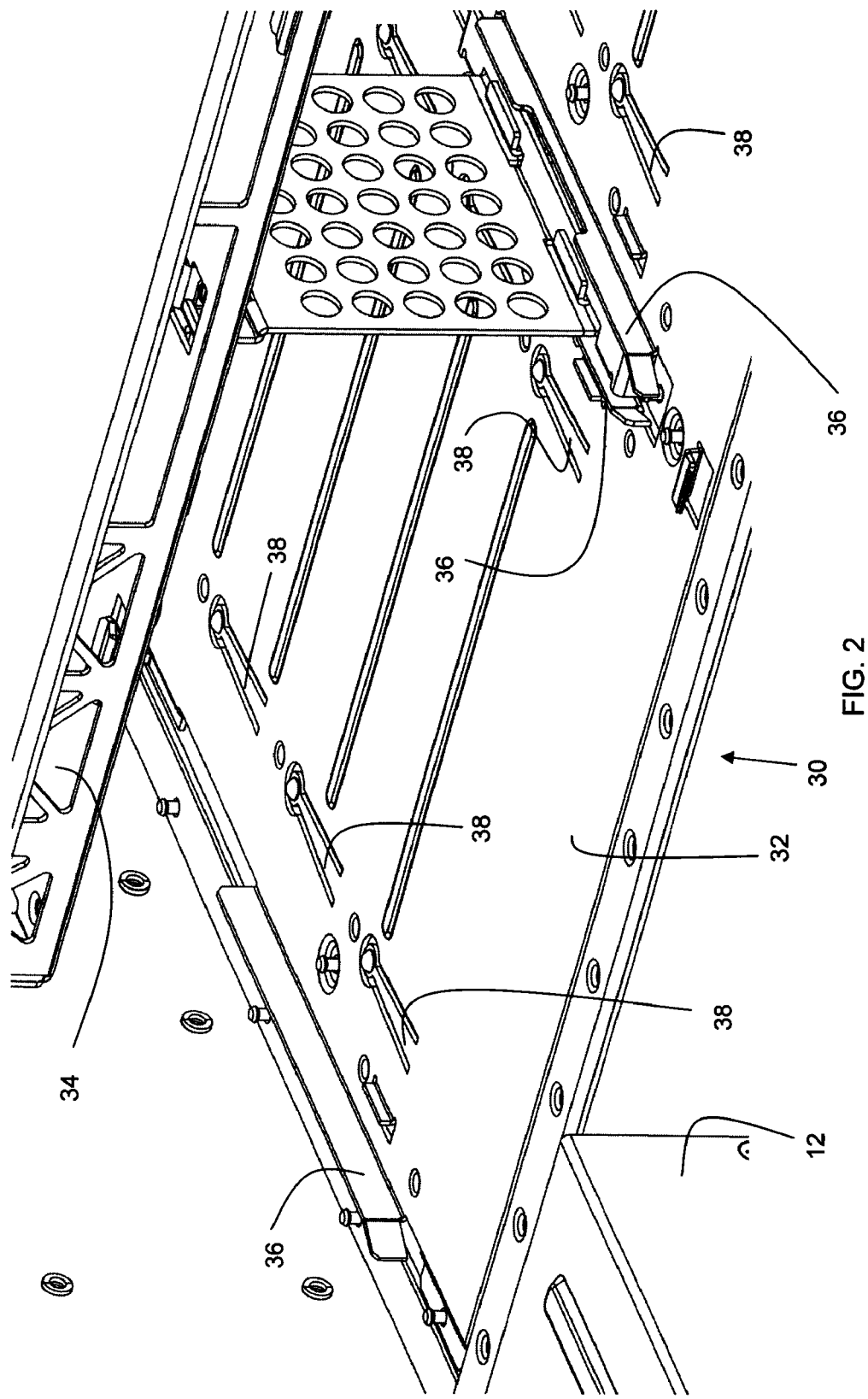
FIG. 2 is an enlarged perspective view of a portion of FIG. 1.

In the example shown in FIGS. 1 and 2 the first resilient members 38 and second resilient members 38' are on the chassis 12. In this embodiment each resilient member 38 or 38' is in the form of a cantilever member that may be spoon shaped. It will be appreciated that the resilient members 38 and 38' need not be spoon shaped and need not be of the same shape. For example, the resilient members may be generally rectangular or triangle in shape. The resilient member 38 and 38' bears against an appropriate surface 14 or 16 of the module 12.

Figure 3:
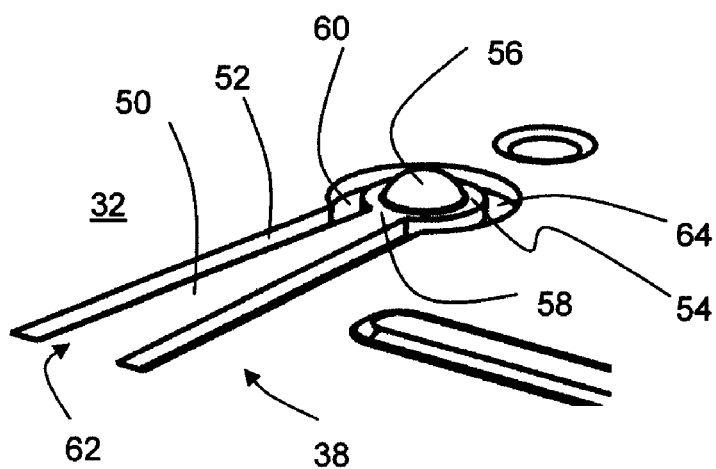
FIG. 3 is a schematic perspective view of a resilient member of the embodiment shown in FIGS. 1 and 2.

An example resilient member 38 is described in more detail with reference to FIG. 3. The example resilient member 38 comprises an elongate portion 50 integrally connected at 62 to the weight bearing surface 32 of the chassis 30 and a head portion 54. The resilient member 38 is positioned inside a similarly shaped recess formed in the surface 32. It will be appreciated that the resilient member 38' may be positioned inside a recess of and be connected to the upper inside surface 34.

Figure 7:
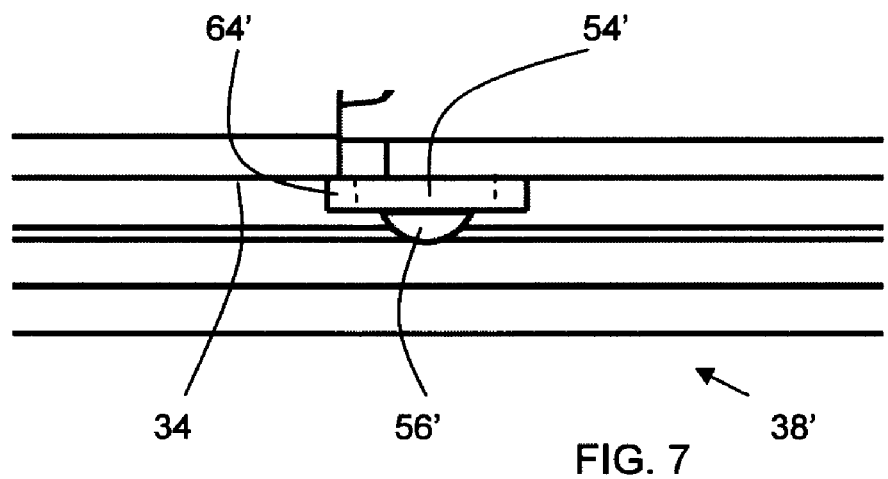
FIG. 7 is an enlarged side elevation of a first resilient member of the embodiment shown in FIG. 6.
Figure 8:
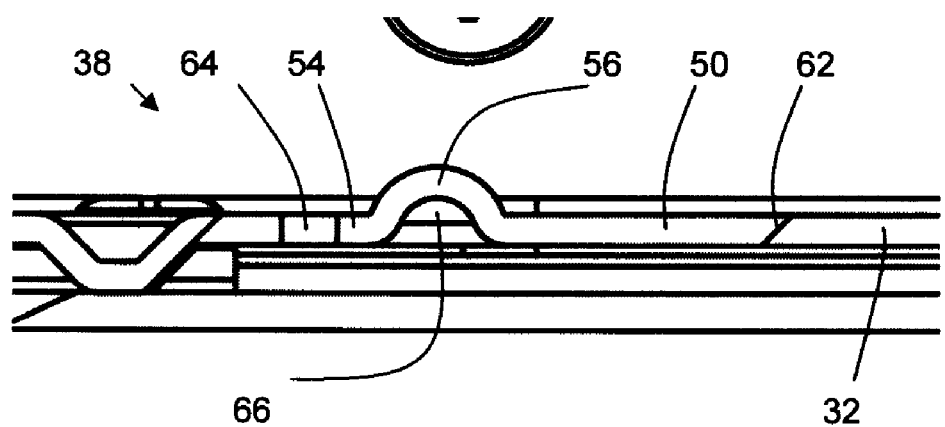
FIG. 8 is an enlarged side elevation of a second resilient member of the embodiment shown in FIG. 6.

The head portion 54 is generally circular and connects to the elongate portion 50 by a neck 58. The recess has an elongate portion 52 which receives the elongate portion 50, a neck portion 60 which receives the neck 58 and a circular portion 64 which receives the head portion 54. The head portion 54 may have a projection 56 extending orthogonally to the length of the elongate portion 52 so as to contact with the bottom surface 14 of the module 12. The projection 56 is in the form of a hollow hemisphere. The hollow 66 is shown in FIG. 8. The projection 56 need not be hollow, a hemisphere or orthogonal. For example, the projection may be solid, conical and/or angled. In the case of the second resilient member 38' the projection will contact the top surface 16 of the module 12. Head portion 54', circular recess portion 64' and projection 56' of second resilient member 38' are shown in FIG. 7. The upper surface 16 and bottom surface 14 of the module 12 have flat portions 24 and 26 which slide under and over the projections 38 and 38' as the module 12 is inserted into the chassis 30.

In an alternative embodiment the resilient members 38 and 38' may comprise a resiliently compressible projection.

Figure 4:
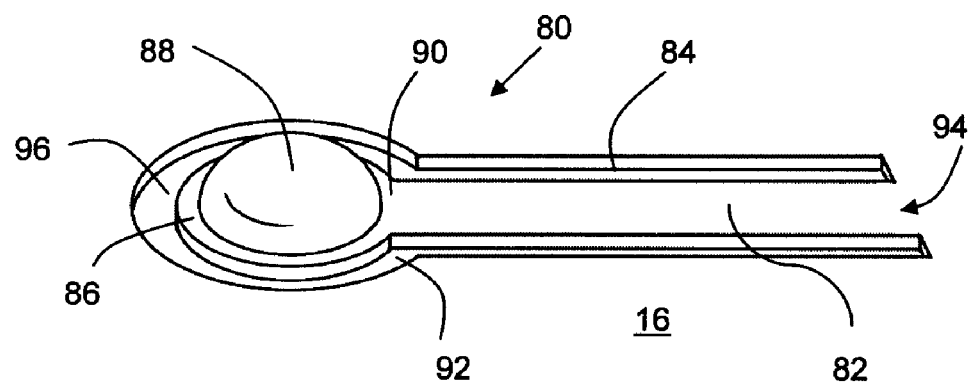
FIG. 4 is a schematic perspective view of a resilient member of a further embodiment of a resilient member of a module.
Figure 5:
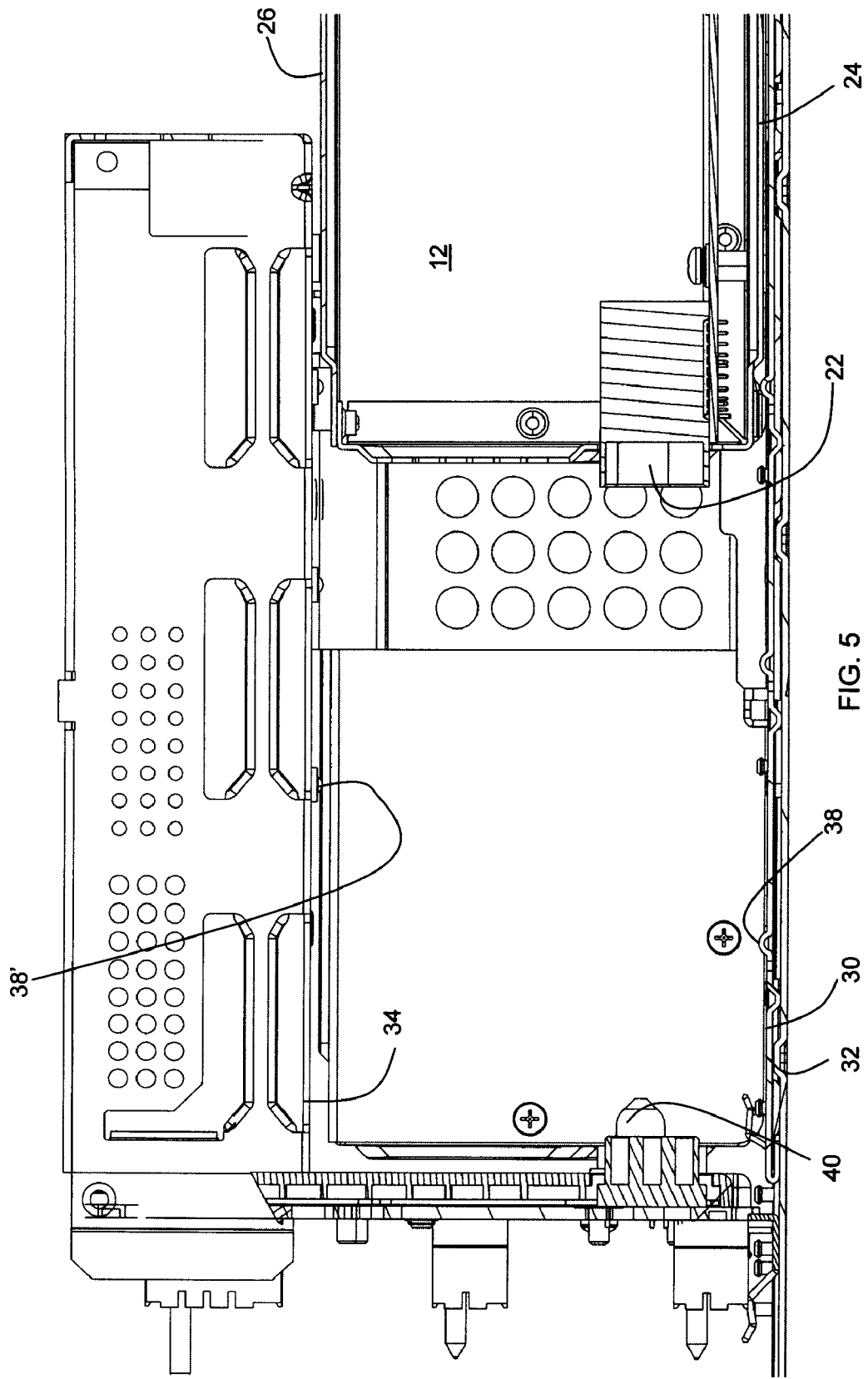
FIG. 5 is a schematic side elevation of the embodiment shown in FIGS. 1 and 2.
Figure 6:
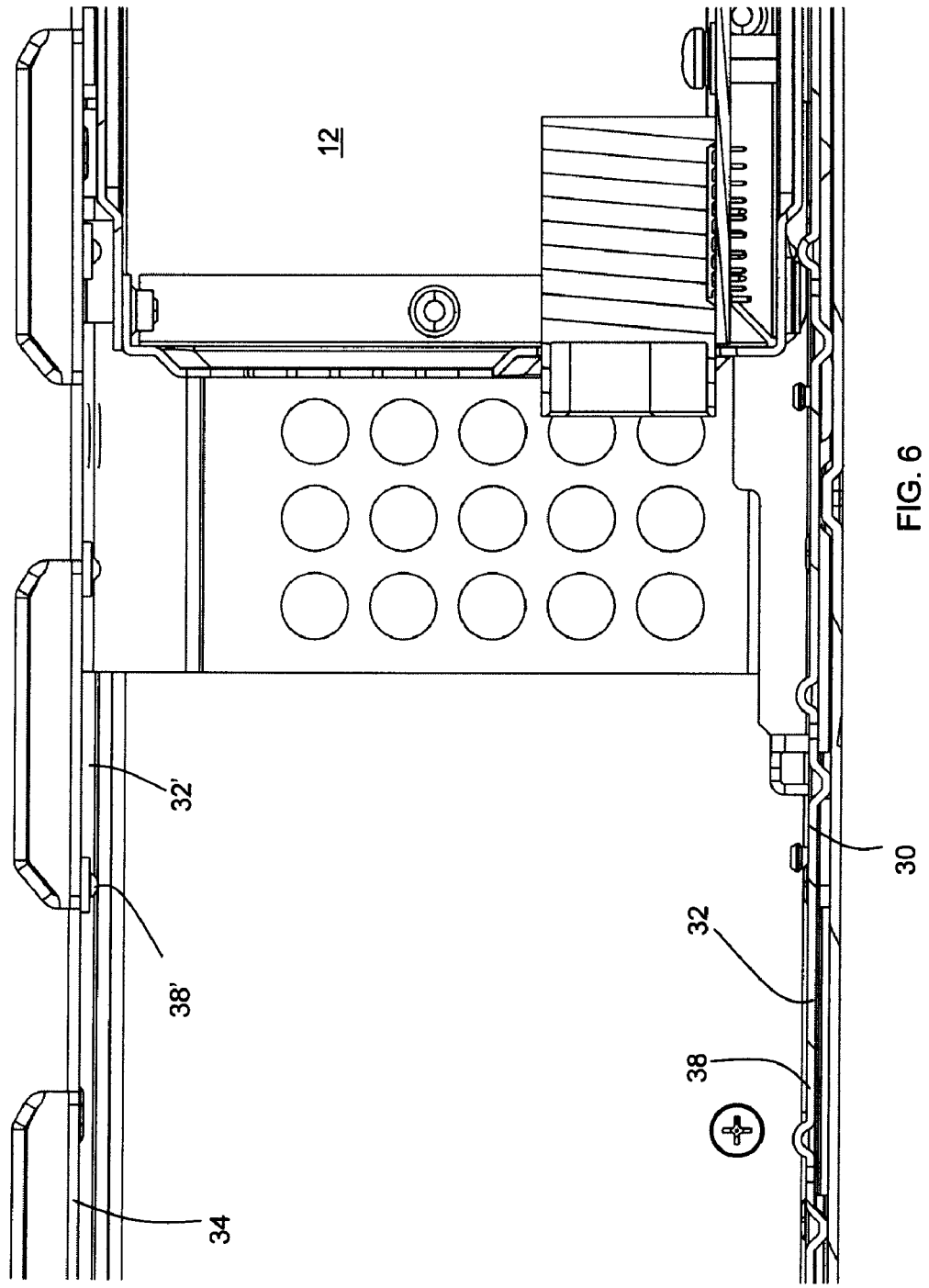
FIG. 6 is an enlarged side elevation of a portion of FIG. 5.

In another embodiment the first resilient members may be formed on the bottom surface 14 of the module 12 and in some embodiments the second resilient members may be formed on the top surface 16 of the module. The weight bearing surface 32 and second surface 34 have flat portions 42 & 44 (in FIG. 9) which the first and second resilient members can contact and move over. An example of one of the second resilient members 80 formed on the top surface 16 of the module 12 is illustrated in FIG. 4. In this embodiment the resilient member 80 is also in the form of a spoon shaped cantilever. Resilient member 80 need not be spoon shaped.

The example resilient member 80 comprises an elongate portion 82 integrally connected at 94 to the top surface 16 and a head portion 86. The resilient member 80 is positioned inside a similarly shaped recess formed in the surface 16. It will be appreciated that a first resilient member connected to the bottom surface 14 of module 12 may instead be positioned inside a recess of and be connected to the bottom surface 14.

The head portion 86 is roughly circular and connects to the elongate portion 82 by a neck 90. The recess has an elongate portion 84 which receives the elongate portion 82, a neck portion 92 which receives the neck 90 and a circular portion 96 which receives the head portion 86. The head portion 86 has a hemispherical projection 88 extending upwardly so as to contact with the upper surface 34 of the chassis 30. In the case of the first resilient member the projection will contact the weight bearing surface 32. The weight bearing surface 32 and upper surface 34 each comprise a flat portion over which the first resilient members can slide as the module 12 is inserted.

In an embodiment the first resilient members 38 are on the module 12 and further resilient members are on the chassis 30. In an embodiment the second resilient members 38' and 80 are on the module 12 and the chassis 30.

Typically the module body and chassis body are formed of metal. The resilient members may be formed by punching and/or cutting the metal so as to form the recess and projection. In this embodiment each projection of each resilient member forms a metal on metal contact with the module/chassis, thus each resilient member forms an electrical connection between the module 12 and the chassis 30. This can be an effective way of electrically grounding the module 12 with respect to the chassis 30.

In an alternative embodiment the resilient members are formed of a resiliently compressible or a resiliently flexible substance, such as rubber or plastics.

As seen in FIG. 2, the chassis 30 may be provided with guides 36 for lateral orientation of the module 12 during insertion into the chassis 30. The guides 36 contact opposite side walls 18 of the module 12 and assist in making it correctly positioned in the horizontal plane.

Figure 9:
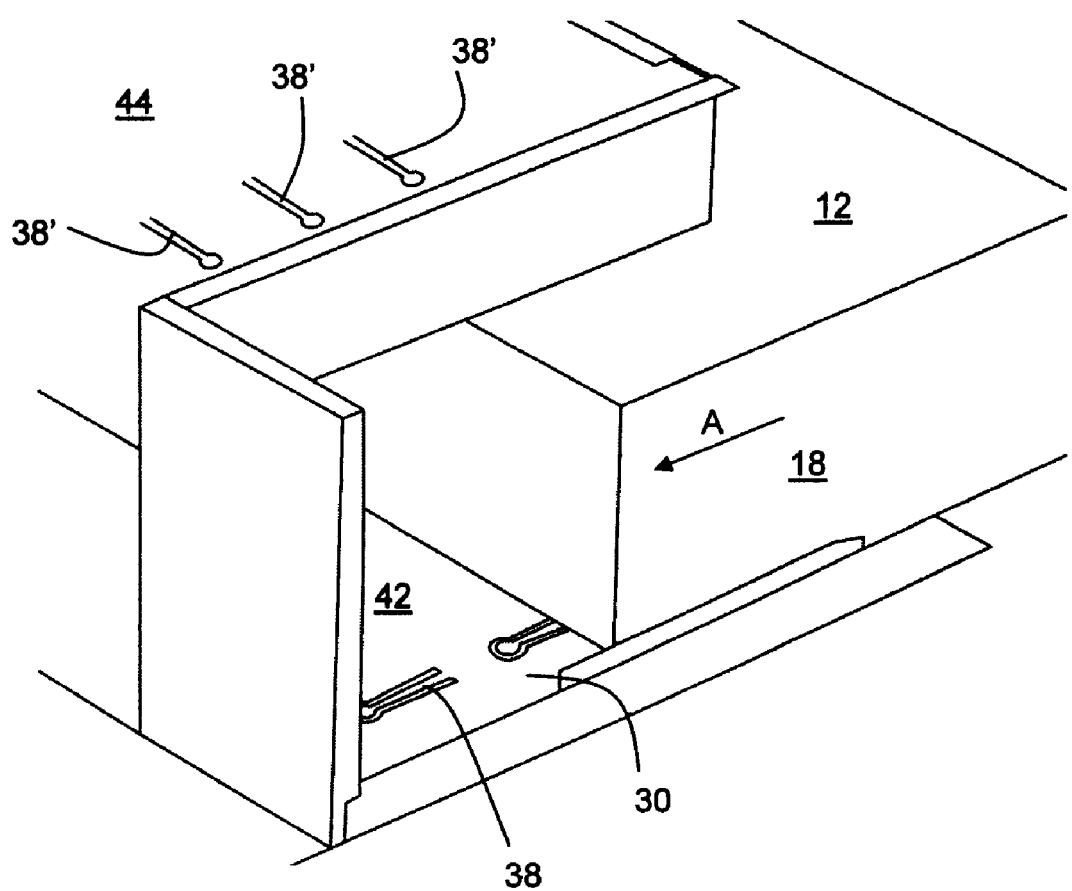
FIG. 9 is a schematic perspective view of another embodiment of a module and chassis of an apparatus.

Referring to FIG. 9, the orientation of the length of each first of the resilient members 38 may be in line with the direction of insertion A of the module 12 into the chassis 30. Further the head 54 is further down the line of insertion A than the elongate portion 50. However other orientations are possible. The orientation of the length of each of the second resilient members 38' may be transverse to (typically perpendicular to) the direction of insertion A of the module 12 into the chassis 30. The head 54 is laterally oriented relative to the module 12. Again other orientations are possible. The orientation of the second resilient members 38' may be the same as the orientation of the first resilient members 38.

An example use of an embodiment is the installation of a module 12, such as a power supply or an electronics module, into the chassis 30, such as a rack mounting assembly. When the module 12 is inserted into the chassis 30, which has resilient members on the chassis 30, the resilient members 38 make contact with the module bottom surface 14 and the second resilient members 38' contact the top surface 16. If the resilient members are on the module 12, then the first resilient members contact the weight bearing surface 32 and the second resilient members 80 contact the upper inner surface 34 of the chassis 30.

The resilient members are caused to deflect due to the relative size and positioning of the projections 56/88 on the resilient members, the size of the module 12 and the size in the inside of the chassis 30. This allows the module 12, when fully inserted, to be positioned between the upper and lower surfaces 34 & 32 of the inside of the chassis 30 and not biased against either surface only. Typically the result is that the module 12 is more likely to be correctly positioned in the chassis 30 and/or relative to a connector. When the module 12 interfaces with a connector it is more likely to not be cocked or skewed.

When using modules 12 of different weights, positioning of the module 12 can be relatively unchanged for minor weight variations. Weight variations can be accommodated by having the weight be a relatively small component of the force carried by the first resilient members (which the majority of the force being the biasing force provided by the second resilient members). Also the resistance to deflection of the resilient members can be significantly greater than the weight. This can be achieved by making the resilient members sufficiently stiff and/or by having a significant number of resilient members to distribute the weight. The desired stiffness of the resilient members can be provided by adjusting the thickness, width and length of the elongate portion 50. Further still, particularly heavy modules 12 can have resilient members manufactured on the bottom surface 14 to accommodate the additional weight relative to lighter modules 12. When a universal chassis is used and a particularly heavy module is to be inserted, the module can be provided with the resilient members to account for the additional weight beyond that which the chassis is designed for.

Due to the rounded shape of the hemispheres 56 & 88 friction will not unduly limit the ease in which the module 12 can be inserted. In many cases the insertion should be easier that in conventional apparatus.

In an embodiment the distribution of weight bearing first resilient members over surface 32 and/or 14 can accommodate modules 12 with a center of gravity significantly different to the geometric centre of the bottom surface 14 of the module 12. In particular if the chassis 30 typically has a module in which its center of gravity is positioned towards one corner, then the number of first modules 38 proximal to that corner when the module is inserted can be greater than elsewhere. Alternatively if the chassis 30 is intended to be generic/universal and/or if an atypical module 12 is to be inserted, then some or extra first resilient members can be added to the bottom surface 14 of the module 12 proximal to the heavy corner.

In the embodiments shown the elongate portion 52 and head portion 54 are substantially level with the surface 32. However in an alternative embodiment the elongate portion 52 may have bends or be curved so that the head portion 54 is raised from the surface 32. This can allow for greater movement of the module 12 relative to the weight bearing surface 32 and/or a greater range of elastic deflection of the first resilient members 38. This is also applicable to the second resilient members 38' and 80.

Modifications and variations are would be apparent to a skilled person are intended to fall within the scope of this disclosure.

The invention claimed is:

1. An apparatus comprising:
a module;
a chassis into which the module is configured to be inserted;
a plurality of first elongate resilient members interposed between the module and a weight bearing surface of the chassis each having a substantial spoon shape comprising a tail connected to one of the chassis or the module and a hollow head contacting the other of the module or the chassis and each of configured to bear at least a portion of the weight of the module when the module is inserted into the chassis;

wherein when said first resilient members are each bearing at least a portion of the weight of the module, said module is at a desired position inside the chassis.

2. The apparatus of claim 1, further comprising a plurality of second elongate resilient members interposed between the module and a second surface of the chassis which is opposite the weight bearing surface when the module is inserted into the chassis each having a substantial spoon shape comprising a tail connected to one of the chassis or the module and a hollow head contacting the other one of the module or the chassis and each of configured to apply a downward biasing force on the module.

3. The apparatus of claim 2, wherein when the module is inserted into the chassis the biasing force applied by the second resilient members and the weight of the module is borne by the first resilient members.

4. The apparatus of claim 2, wherein the second resilient members are each in the form of a cantilever disposed at least partly inside a recess formed in an upper inside surface of the chassis or in a top surface of the module, and the second resilient members each comprise a projection which is either directed towards the weight bearing surface for contacting the module or is directed towards an upper surface of the chassis for contacting the chassis.

5. The apparatus of claim 2, wherein the plurality of second resilient members are formed on the module.

6. The apparatus of claim 1, wherein when the module is inserted into the chassis deflection of each of the first resilient members is such that the module is positioned at a desired height relative to the weight bearing surface.

7. The apparatus of claim 1, wherein the plurality of first resilient members are formed on the chassis.

8. The apparatus of claim 1, wherein the first resilient members are each in the form of a cantilever disposed at least partly inside a recess formed in the weight bearing surface of the chassis.

9. The apparatus of claim 8, wherein the first resilient members each comprise a projection directed towards an upper inside surface of the chassis for contacting the module.

10. The apparatus of claim 1, wherein the first resilient members are formed on the module.

11. The apparatus of claim 10, wherein the first resilient members are in the form of a cantilever disposed at least partly inside a recess formed in a bottom surface of the module.

12. The apparatus of claim 11, wherein the first resilient members each comprise a projection directed towards the weight bearing surface of the chassis.

13. The apparatus of claim 1, wherein the plurality of first resilient members form an electrical connection between the module and the chassis for electrically grounding the module.

14. A chassis comprising:
  a chassis body into which a module is able to be inserted, the module having a bottom surface;
  a plurality of first resilient members disposed at a weight bearing surface of the chassis each having a substantial spoon shape comprising a tail connected to the chassis and a hollow head contacting the module and each engageable with the bottom surface so that when the module is inserted in the chassis the first resilient members each bear at least a portion of the weight of the module;
  wherein when said first resilient members are bearing at least a portion of the weight of the module, the module is at a desired position relative to the bottom surface.

15. The chassis of claim 14, further comprising a plurality of second elongate resiliently deflectable members disposed at a second surface of the chassis which is opposite the weight bearing surface each having a substantial spoon shape comprising a tail connected to the chassis and a hollow head contacting the module and each configured to apply a downward biasing force on the module.

16. A method comprising:
  inserting a module into a chassis;
  interposing a plurality of first elongate resilient members between the module and a weight bearing surface of the chassis, wherein the first members each have a substantial spoon shape comprising a tail connected to one of the chassis or the module and a hollow head contacting the other of the module or the chassis and each of configured to bear at least a portion of the weight of the module when the module is inserted into the chassis; and
  positioning the module at a desired position inside the chassis when said first resilient members are each bearing at least a portion of the weight of the module.

* * * * *